(12) United States Patent  
Xie et al.

(10) Patent No.: US 8,836,387 B1  
(45) Date of Patent: Sep. 16, 2014

(54) METHODS AND SYSTEMS FOR REDUCING JITTER

(75) Inventors: Jin Xie, Longmont, CO (US); Bin Ni, Sunnyvale, CA (US); Mats Oberg, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 203 days.

(21) Appl. No.: 12/984,356

(22) Filed: Jan. 4, 2011

Related U.S. Application Data

(60) Provisional application No. 61/293,127, filed on Jan. 7, 2010.

(51) Int. Cl.  
*H03L 7/06* (2006.01)

(52) U.S. Cl.  
USPC ............ 327/156; 327/147; 375/373; 375/376

(58) Field of Classification Search  
USPC ................ 327/141, 144–163; 331/15–17; 375/373–376  
See application file for complete search history.

(56) References Cited

U.S. PATENT DOCUMENTS

| | | | |
|---|---|---|---|
| 3,757,244 A * | 9/1973 | Giger | 331/17 |
| 6,188,255 B1 * | 2/2001 | Mann | 327/113 |
| 6,566,071 B2 * | 5/2003 | Benson et al. | 435/6.19 |
| 6,973,145 B1 * | 12/2005 | Smith et al. | 375/354 |
| 7,274,232 B2 * | 9/2007 | Lin et al. | 327/158 |
| 2006/0033580 A1 * | 2/2006 | Chen et al. | 331/16 |
| 2007/0183553 A1 * | 8/2007 | Sanders et al. | 375/376 |

* cited by examiner

*Primary Examiner* — Brandon S Cole

(57) ABSTRACT

Methods and systems for compensating reducing jitter produced by a phase-locked loop are disclosed. For example, in a particular embodiment, a phase-locked loop device for reducing jitter may include a voltage-control oscillator (VCO) signal configured to produce a VCO signal, phase-detection circuitry configured to compare an input signal and the VCO signal to produce a phase error signal, and slew-rate limiting circuitry configured to receive the phase error signal and apply a slew-rate limit process on the phase error signal to produce a modified error signal.

20 Claims, 8 Drawing Sheets

METHODS AND SYSTEMS FOR REDUCING JITTER

INCORPORATION BY REFERENCE

This application claims the benefit of U.S. Provisional Application No. 61/293,127 "Use Slew Rate Limiter to Reduce Jitter" filed on Jan. 7, 2010, which is incorporated herein by reference in its entirety.

BACKGROUND

Phase-locked loops (PLLs) are devices that have been used to recover timing information in a wide variety of applications ranging from wireless receivers to memory devices. For example, PLLs may be used with optical data storage systems to extract clock signals, sometimes referred to as the "wobble", spatially embedded in optical media. When the spinning speed of an optical medium changes—or the radial position of a laser head changes relative to the optical medium—so does the wobble frequency produced by a device reading the optical media. PLLs allow an optical reading device to track changes in the wobble regardless of changes in spinning speed and head position. By locking on to the wobble, a PLL can adjust its output clock frequency so that information may be reliably read from and written to the optical medium.

For a Compact Disc (CD), the nominal bit length is 300 nm. For a writable Digital Video Disc (DVD+), the nominal bit length is 130 nm. An optical read/write device appropriately locked on to the wobble should ideally write bits of exactly the nominal bit length. Those differences between the actual bit lengths of information written onto a disc and the nominal bit length are often referred to as "jitter." Generally, jitter may cause a host of problems for optical storage systems. For example, if large jitter is present when a device is writing data to an optical disc, the irregular bit information imprinted in the disc may cause difficulty when later retrieving the imprinted information. Accordingly, it is generally advantageous for PLLs in optical read/write devices to reliably track the wobble of an optical disc and to minimize jitter when writing to the optical disc.

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

SUMMARY

Various aspects and embodiments of the invention are described in further detail below.

In an embodiment, a phase-locked loop device for reducing jitter may include a voltage-control oscillator (VCO) signal configured to produce a VCO signal, phase-detection circuitry configured to compare an input signal and the VCO signal to produce a phase error signal, and slew-rate limiting circuitry configured to receive the phase error signal and apply a slew-rate limit process on the phase error signal to produce a modified error signal.

In another embodiment, a method for reducing jitter in a phase-locked loop may include receiving a wobble signal from an optical medium, performing a phase-detection operation on the wobble signal and a VCO signal to produce a phase error signal, applying a slew-rate limit process on the phase error signal to produce a modified error signal, and using the modified error signal to reduce jitter in VCO signal.

In yet another embodiment, a phase-locked loop device for reducing jitter may include a voltage-control oscillator (VCO) configured to produce a VCO signal, phase-detection circuitry configured to compare a wobble signal from an optical drive and the VCO signal to produce a phase error signal, and slew-rate limiting means for receiving the phase error signal and applying a slew-rate limit process on the phase error signal to produce a modified error signal, wherein the modified error signal is used by the VCO to reduce jitter in the VCO signal.

BRIEF DESCRIPTION OF THE DRAWINGS

The features and nature of the present disclosure will become more apparent from the detailed description set forth below when taken in conjunction with the accompanying drawings in which reference characters identify corresponding items.

DETAILED DESCRIPTION OF EMBODIMENTS

The disclosed methods and systems below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically.

For the purpose of this disclosure, the "wobble" of an optical storage disc as known to those skilled in the art may be described as a radial groove embedded in a compact disc (CD), digital video disc (DVD), Blu-ray disc, or similar media. This radial groove may have a snake-like periodic bending, and may provide tracking and disc speed information to optical reading and writing devices. The term "wobble" may also be used to describe a timing signal produced by the radial groove of the same name. While the wobble frequencies for a CD (1×), DVD− (1×), DVD+(1×) and Blu-ray (1×) are 22.05 kHz, 140.6 KHz, 817.4 KHz, and 956.5 kHz respectively, the particular frequency of a wobble (or alternatively "wobble signal") may change from standard to standard as may be found advantageous or desirable.

Figure 1:
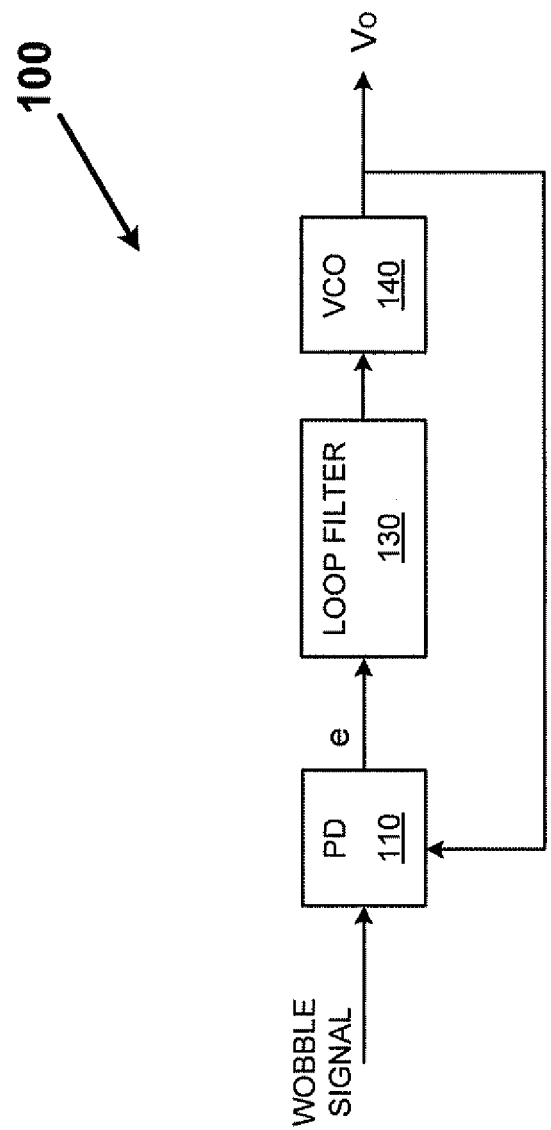
FIG. 1 depicts a first phase-locked loop device.

FIG. 1 depicts a first phase-locked loop device 100 capable of locking onto a wobble clock signal embedded onto a compact disc (CD), a digital video disc (DVD) or other optical medium. As shown in FIG. 1, the first phase-locked loop device 100 includes a phase-detection device (PD) 110, a loop filter 130 and a voltage-controlled oscillator (VCO) 140.

In operation, the phase detector 110 may receive as an input a wobble signal containing an embedded clock, as well as a VCO feedback signal produced by the VCO 140, to produced an error signal e. The error signal e may then be fed to the loop filter 130 to produce a control signal, which may in turn be used to control the VCO 140. As the phase-locked loop device 100 may be used to produce a clock signal useful to control physical bit-lengths of data written to an axially-spinning optical memory device, it is to be appreciated that it may be advantageous to reduce jitter produced by the VCO.

The phase detector 100 may be made from any combination of analog and/or digital circuitry as is well known to those skilled in the art. For example, a fully digital phase detector may be made from a combination of timers, S-R flops and glue logic.

The loop filter 130 may be made from a combination of analog and/or digital multipliers and adding circuitry. While the loop filter has a transfer function $V_{OUT}=(G_p+(1/s)G_f))$ VIN it should be appreciated that the particular configuration and transfer function of the loop filter 130 may change from embodiment to embodiment taking into consideration that the loop filter's transfer function and gain may control the PLL's lock-in frequency, bandwidth and other characteristics.

As with the phase detector 110 and loop filter 130, the VCO 140 may be constructed of any combination of analog and/or digital circuitry, For example, the VCO 140 may be constructed from a combination of amplifiers, resistors, capacitors and transistors, or alternatively constructed using dedicated digital processing hardware.

Figure 2:
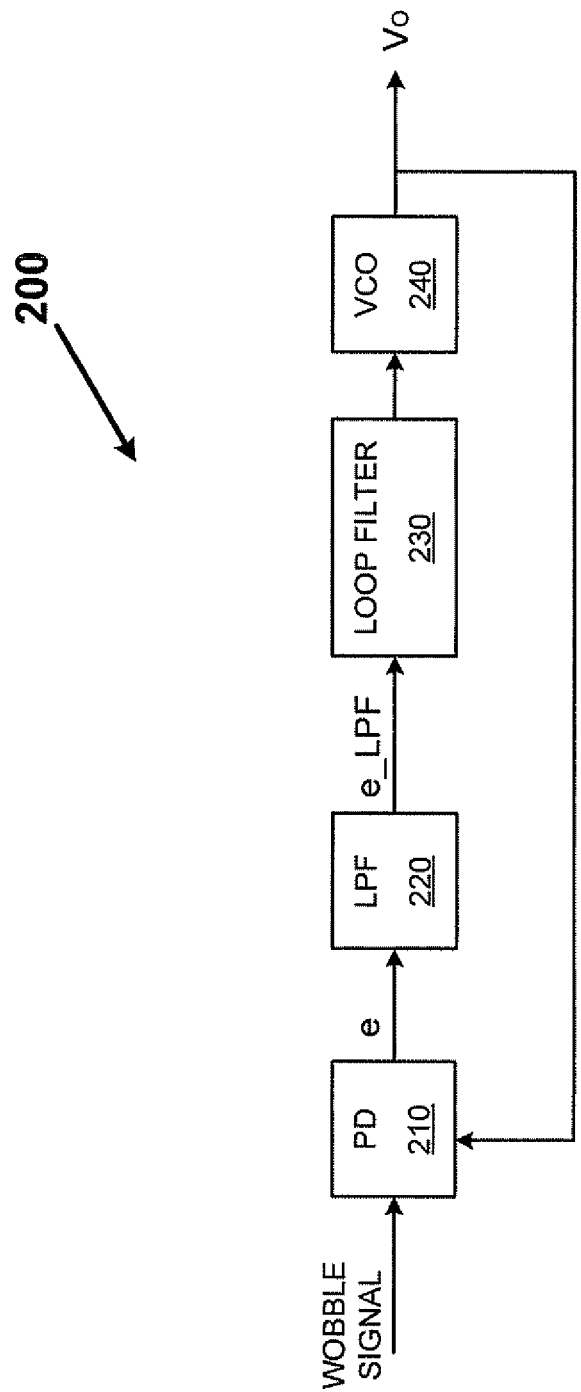
FIG. 2 depicts a second phase-locked loop device using a low-pass filter to reduce jitter.

FIG. 2 depicts a second phase-locked loop device 200. As shown in FIG. 2, the second phase-locked loop device 200 includes a phase-detection device 210, a low-pass filter (LPF) 220, a loop filter 230 and a VCO 240.

The phase-detection device 210, loop filter 230 and VCO 240 of FIG. 2 may be identical or similar to their counterparts {110, 130 and 140} in FIG. 1, and their respective overall theory of operation may remain the same. However, in the embodiment of FIG. 2 the error signal e is received by the LPF 220 to produce a modified error signal e_LPF. That is, LPF 220 may be configured to remove high-frequency components from the error signal e using a linear filtering process, and provide the modified error signal e_LPF to the loop filter 230. A particular advantage to the LPF 220 is that it may be used to remove high-frequency components in the error signal produced by SYNC marks and/or information bits in the wobble signal. As is known to those in the related arts a SYNC mark is a timing signal embedded onto a disc used to represent a leading end of a frame of the disc. Typically, SYNC marks appear as a specific pattern having predetermined bit intervals.

Figure 3:
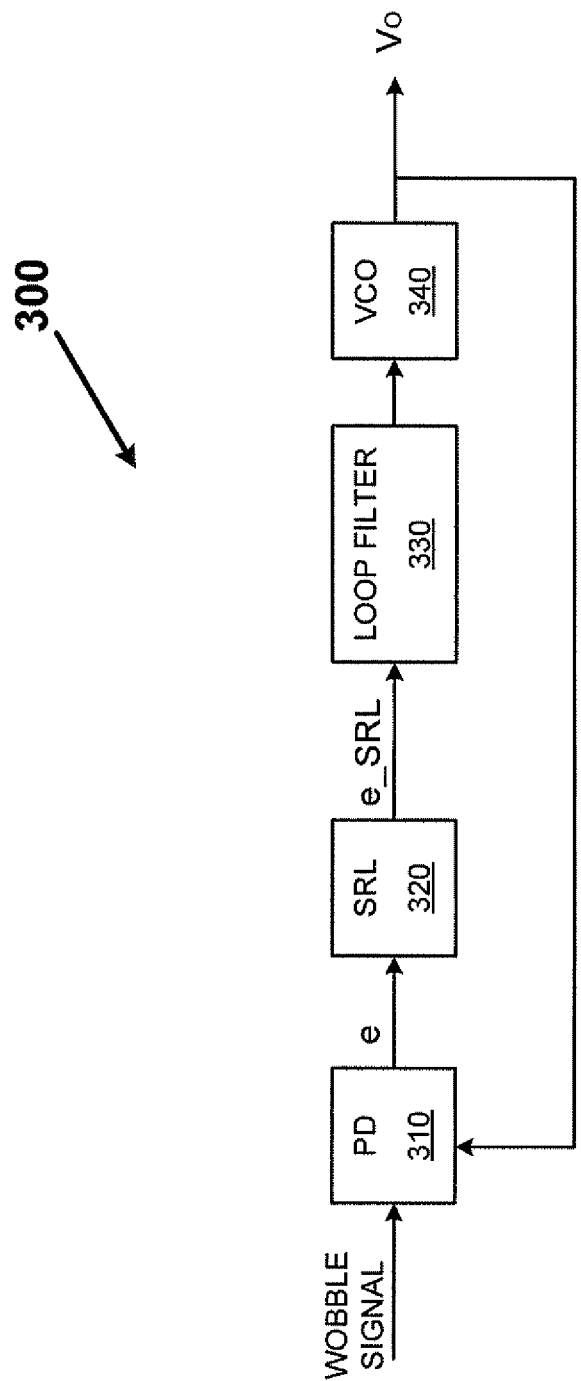
FIG. 3 depicts a third phase-locked loop device using a slew-rate limiter to reduce jitter.

FIG. 3 depicts a third phase-locked loop device 300. As shown in FIG. 3, the third phase-locked loop device 300 includes a phase-detection device 310, a slew-rate limiting device (SRL) 320, a loop filter 330 and a VCO 340.

Again, the phase-detection device 310, loop filter 330 and VCO 340 of FIG. 3 may be identical or similar to their counterparts {110, 130 and 140} in FIG. 1, and their respective overall theory of operation may remain the same. However, in the embodiment of FIG. 3 the error signal e may be received by the SRL 320 to produce a modified error signal e_SRL. Similar to the LPF 220 of FIG. 2, the SRL 320 may be configured to remove high-frequency components from the error signal e to provide a modified error signal to the loop filter 230. However, unlike the LFP 220 of FIG. 2, the SRL 320 can apply a non-linear filtering process to better remove high-frequency components in the error signal produced by wobble, information bits and SYNC marks (and other signals) while treating other components, such as noise, in a similar fashion to an LPF.

As is known to those skilled in the relevant arts, slew-rate limiting circuitry in general may be made from any combination of analog and/or digital circuitry. While slew-rate limiting devices may operate differently from embodiment to embodiment, the SRL 320 may be configured to process the error signal e according to the EQs (1)-(3) below:

| | | |
|---|---|---|
| e_SRL(m + 1) = e_SRL(m) + delta | e − e_SRL(m) > delta | EQ(1) |
| e_SRL(m + 1) = e_SRL(m) − delta | e − e_SRL(m) < −delta | EQ(2) |
| e_SRL(m + 1) = e_SRL(m) | otherwise | EQ(3) | where e is the error signal, e_SRL(m) is the modified error signal for time increment m, e_SRL(m+1) is the modified error signal for time increment m+1, and delta is a predefined operational parameter greater than zero.

Assuming that the phase detection device has an operational update rate so as to update the error signal e at a rate of NT, the SRL 320 may be configured to update at a rate of nT, where N an n are positive integers and T is a time period related to bit duration, e.g. T=1/(channel bit frequency). Assuming N=686, then n may be one of {1, 2, 7, 14, 49, 98, 343}. Note that the slew rate/slope of the SRL 320 is limited to slope=delta/nT.

Figure 4:
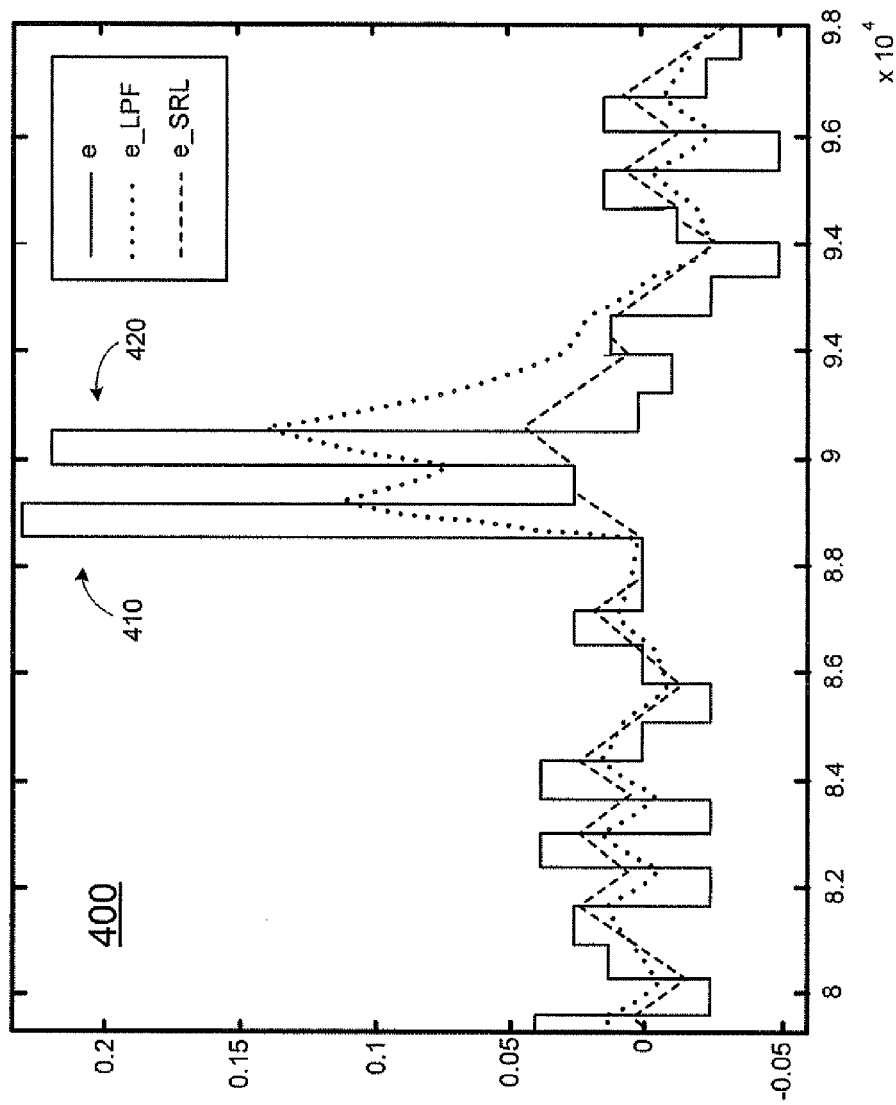
FIG. 4 is a graph illustrating the effects of a low-pass filter and a slew-rate limiter on an error signal of a phase-locked loop.

The various operational parameters {N, n and delta} of the SRL 320 may be set with several criteria in mind. For example, the graph 400 of FIG. 4 illustrates the comparative effects of a low-pass filter and a slew-rate limiter on an error signal of a PLL. The error signal e (represented by a solid line) is shown together with a dotted line representing the error signal e modified by a low-pass filter (e_LPF) and a dashed line representing the error signal e modified by a slew-rate limiter (e_SRL). In the example of FIG. 4, N=686, n=1 and delta=2.9e-5. In the example of FIG. 4, there are two tall peaks 410 and 420 in the middle of graph 400 representing the error signal generated by SYNC marks. Such large peaks 410 and 420 contain more high-frequency components than small changes in the error signal e, which will lead to larger jitter.

Figure 5:
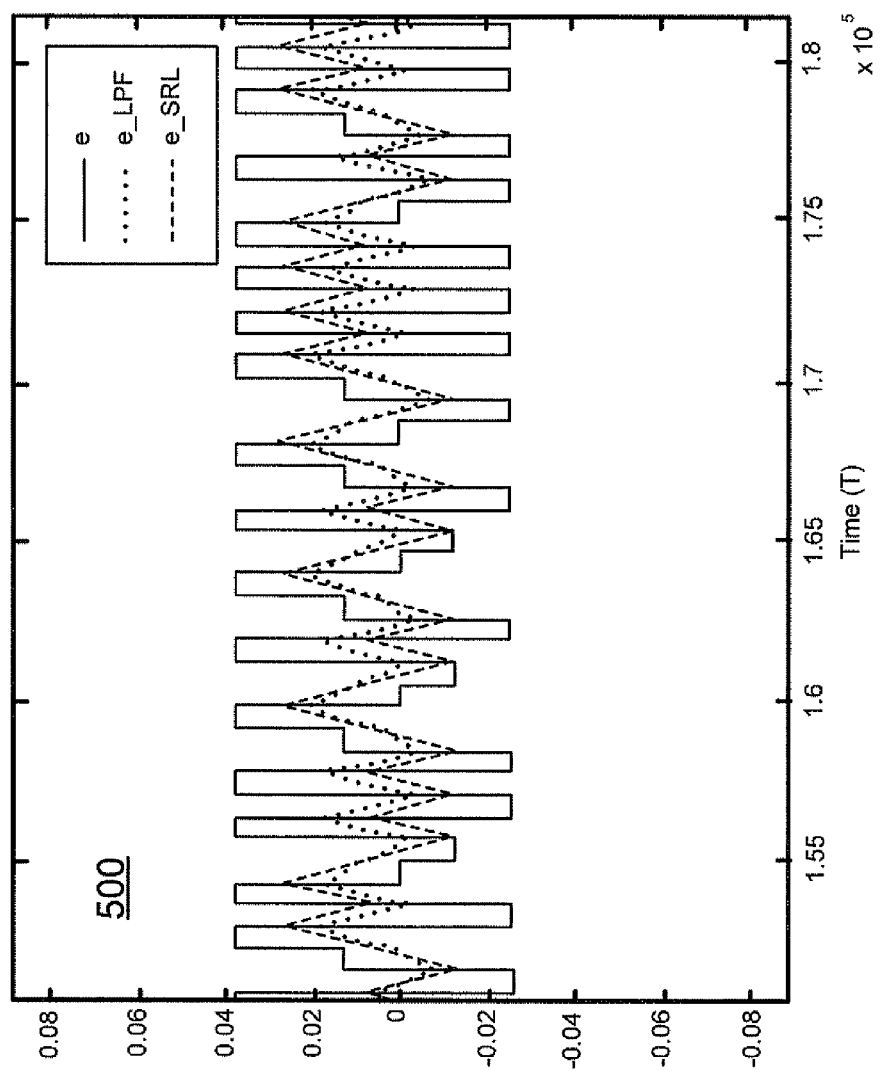
FIG. 5 is a second graph illustrating the effects of a low-pass filter and a slew-rate limiter on an error signal of a phase-locked loop.

FIG. 5 is a second graph 500 illustrating the effects of a low-pass filter and a slew-rate limiter the error signal e of a PLL. As with FIG. 4, in the example of FIG. 5, N=686, n=1 and delta=2.9e-5. From FIGS. 4 and 5, it is apparent that e_LFP and e_SRL are similar when changes to the error signal e are small. Note, however, that while both e_LPF and e_SRL both respond similarly to small changes in the error signal e, when confronted with large jumps in the error signal e, the e_SRL signal demonstrates that a slew-rate limiting device may remove much more of the high-frequency signal components of the error signal e than a low-pass filter. Accordingly, a slew-rate limiting device may be thought of as an amplitude-dependant filter and/or a non-linear filter.

An advantage to using a slew-rate limiting device over a low-pass filter is that the slew-rate limiter has the ability to better remove signal components caused by SYNC marks while responding in a near equal fashion to signal components caused by random noise and frequency drift. While SYNC marks don't reflect timing drift of the wobble, they do introduce high-frequency frequency components into an error signal. As the presence of such high-frequency components into a PLL may increase jitter in the PLL's output, it may be apparent to those skilled in the art that a slew-rate limiting device may reduce jitter in a PLL's output while allowing the PLL to competently track changes in a wobble signal.

It is to be appreciated that the cutoff frequency of a PLL cannot be too low without compromising the ability of the PLL to track timing drift in the wobble. Thus, when implementing a low-pass filter into a PLL, the cutoff frequency of the low-pass filter may be set just above the edge of the bandwidth of the PLL to allow the PLL to track changes in the wobble signal. Similarly, when implementing a slew-rate limiting device, the operational parameters may be set to form an effective cutoff filter that allows the PLL to track changes in the wobble signal. However, by virtue of its non-linear nature the same operational parameters of a slew-rate limiting device may also be set to form a second effective cutoff filter that allows the phase-locked loop to effectively filter SYNC marks in the wobble signal.

Figure 6:
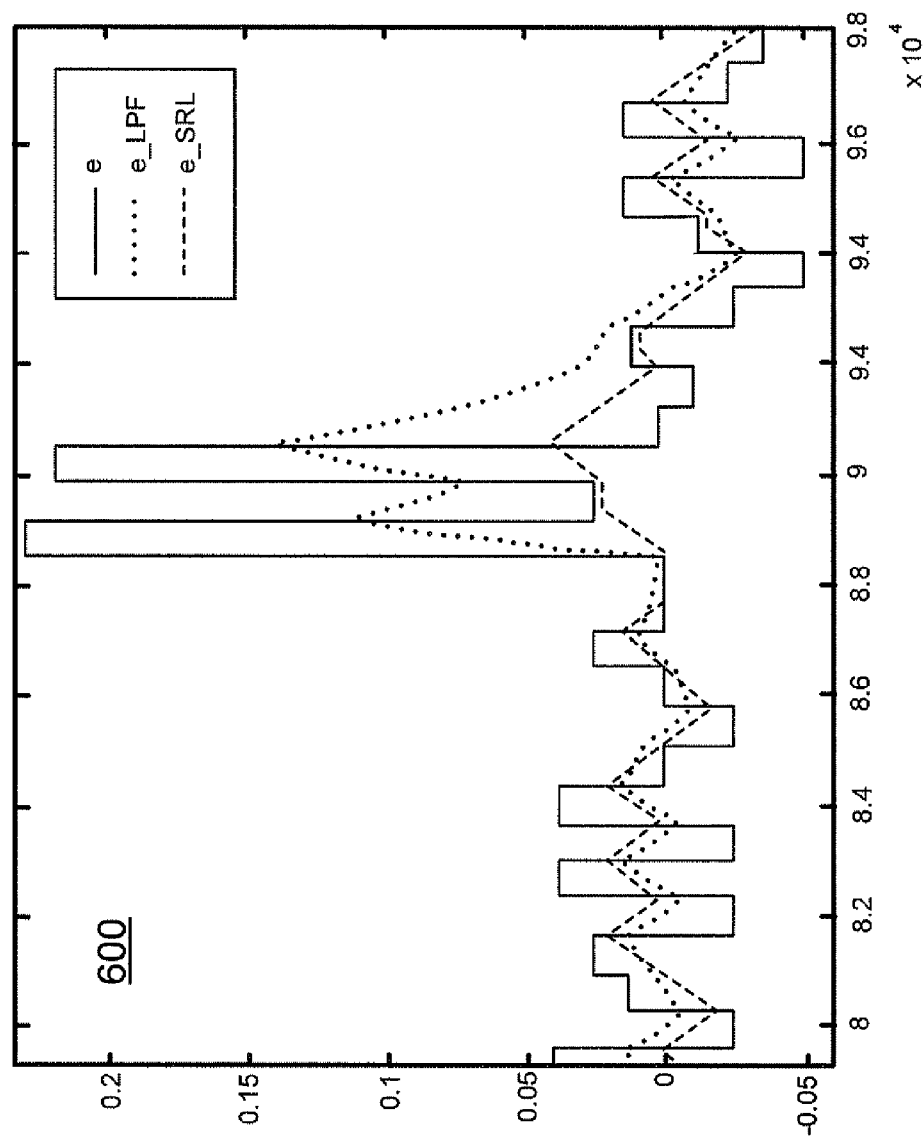
FIG. 6 is a third graph illustrating the effects of a low-pass filter and a slew-rate limiter on an error signal of a phase-lock loop.
Figure 7:
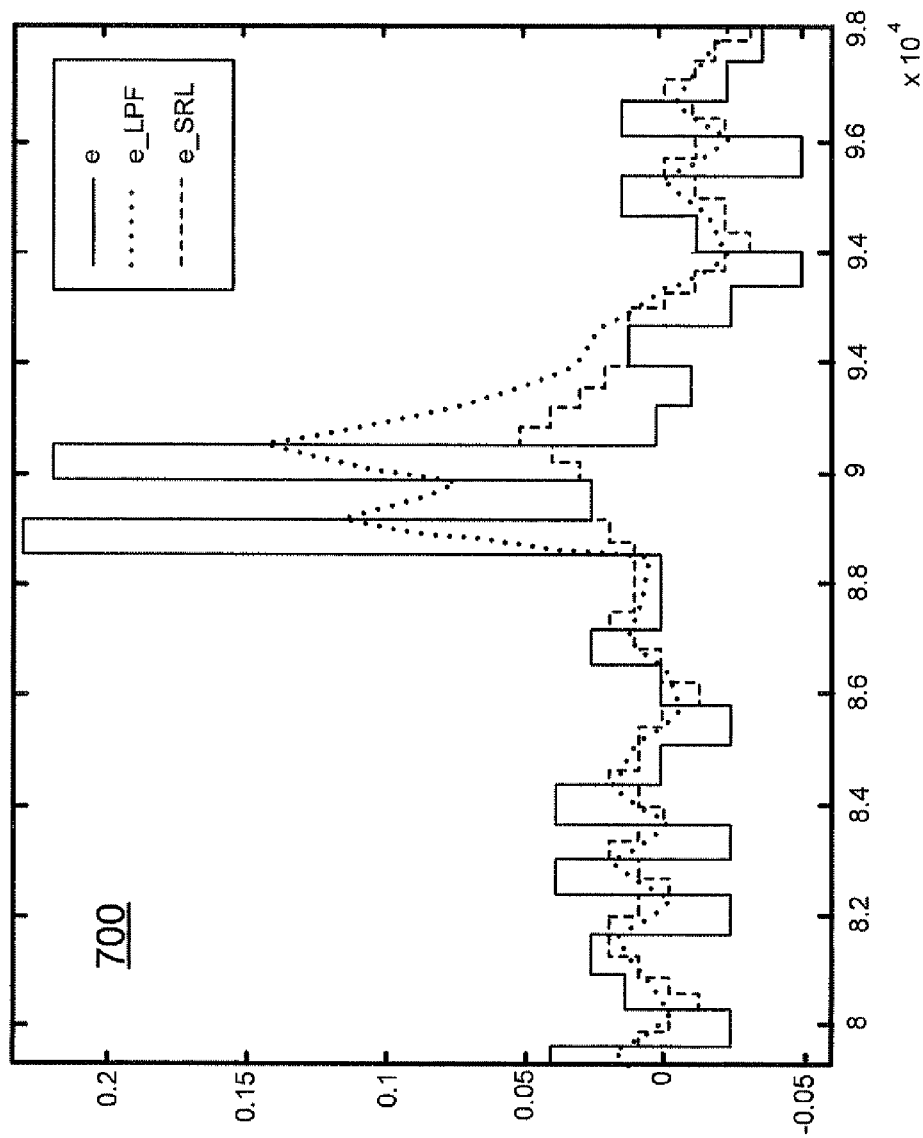
FIG. 7 is a fourth graph illustrating the effects of a low-pass filter and a slew-rate limiter on an error signal of a phase-lock loop.

FIG. 6 is a third graph 600 illustrating the effects of a low-pass filter and a slew-rate limiting device on an error signal of a phase-locked loop. In the example of FIG. 6, N=686 and n=98. FIG. 7 is a fourth graph 700 illustrating the effects of a low-pass filter and a slew-rate limiter on an error signal of a phase-locked loop. In the example of FIG. 7, N=686 and n=343. It can be seen in FIG. 6 and FIG. 7 that as n increases relative to N, the high-frequency components in e_SRL increase as well. Accordingly, while implementations of PLLs using a high n value may be easier to implement, such high n values may lead to greater jitter. Thus, the operational parameters of a slew-rate limiting device may vary from embodiment to embodiment as an issue of design tradeoff.

Figure 8:
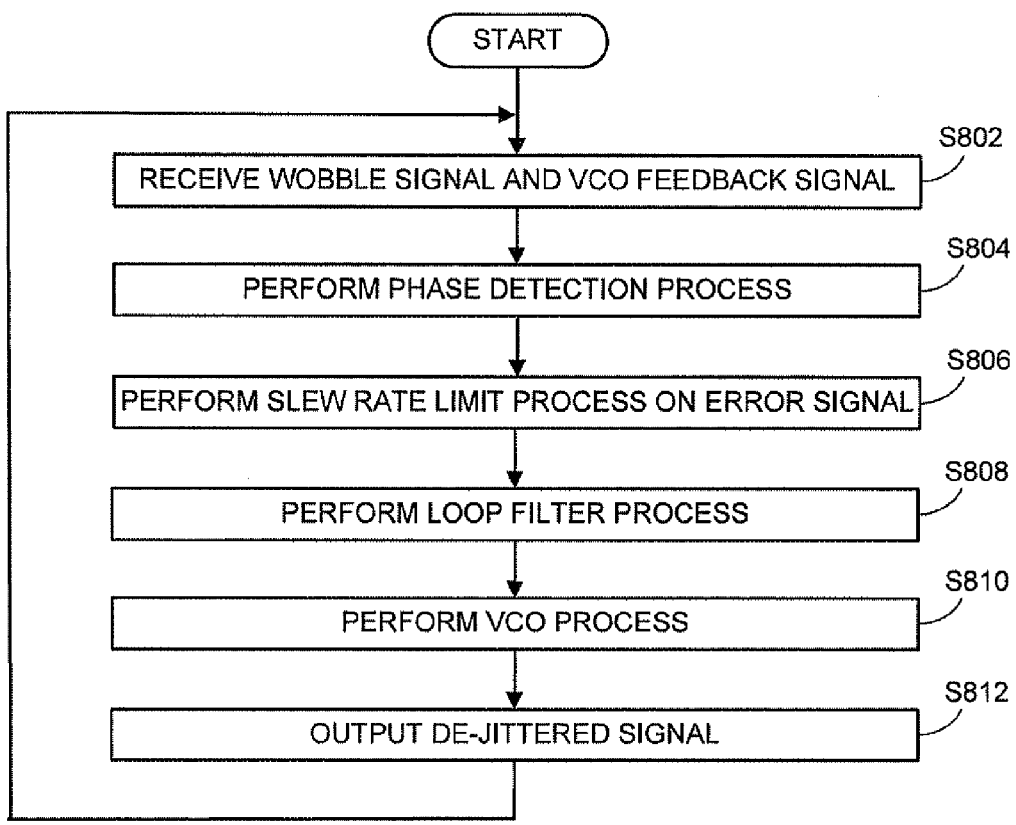
FIG. 8 is a flowchart outlining an operation for reducing jitter using a slew-rate limiter.

FIG. 8 is a flowchart outlining an operation for reducing jitter using a slew-rate limiter. While the below-described steps are described as occurring in a particular sequence for convenience, it is to be appreciated by those skilled in the art that the order of various steps may possibly be changed from embodiment to embodiment. It is further to be appreciated that various steps may occur simultaneously or be made to occur in an overlapping fashion.

) The process starts in step S802 where an input signal, such as a wobble signal from an optical disc, as well as a VCO feedback signal generated by a VCO of a PLL, may be received. Next, in step S804, a phase detection process may be performed on the received signals of step S802 to produce an error signal. Then, in step S806 a slew-rate limiting process may be performed on the error signal of step S804 to produce a modified error signal. In various embodiments the underlying slew-rate limiting process may take the form of EQs (1)-(3). Also, as discussed above, the operational parameters of the slew-rate process may be set to form a first effective cutoff filter that allows the PLL incorporating the slew-rate limiting process to track changes in a wobble signal, but may also be set to form a second effective cutoff filter that allows the PLL to effectively filter SYNC marks embedded in the wobble signal. Control continues to step S808.

In step S808, a loop filter process may performed on the modified error signal to produce a control signal. Next, in step S810 a VCO process may be performed on the control signal of step S808 to produce a de-jittered VCO output signal. Then, in step S812, the de-jittered VCO output signal may be provided to support other processes, such as a write process for the optical disc from which the wobble signal of step S802 is derived. Control then jumps back to step S802 where the steps of S802-S812 may be repeated as desired.

While the above-disclosed methods and systems have been described in conjunction with the specific embodiments thereof, it is evident that many alternatives, modifications, and variations will be apparent to those skilled in the art.

Accordingly, embodiments of the above-disclosed methods and systems as set forth herein are intended to be illustrative, not limiting. There are changes that may be made without departing from the spirit and scope of the above-disclosed methods and systems.

What is claimed is:

1. A phase-locked loop device for reducing jitter, comprising:
   a voltage-control oscillator (VCO) configured to produce a VCO signal;
   phase-detection circuitry configured to compare an input signal and the VCO signal to produce a phase error signal; and
   slew-rate limiting circuitry configured to receive the phase error signal and apply an amplitude-dependent non-linear filtering process on the phase error signal to produce a modified error signal by reducing a sporadic jump in an amplitude of the phase error signal.

2. The phase-locked loop device of claim 1, wherein the input signal includes a wobble signal.

3. The phase-locked loop device of claim 2, wherein an output of the phase-locked loop device is used to control physical bit-lengths of data written to an axially-spinning optical memory device.

4. The phase-locked loop device of claim 3, wherein the slew-rate limiting circuitry is configured to effectively reduce an effect of SYNC marks embedded in the wobble signal.

5. The phase-locked loop device of claim 4, wherein the slew-rate limiting circuitry is configured to process the error signal according to the following formula:

| | |
|---|---|
| e_SRL(m + 1) = e_SRL(m) + delta | e − e_SRL(m) > delta |
| e_SRL(m + 1) = e_SRL(m) − delta | e − e_SRL(m) < −delta |
| e_SRL(m + 1) = e_SRL(m) | otherwise | where e is the error signal, e_SRL(m) is the modified error signal for time increment m, e_SRL(m+1) is the modified error signal for time increment m+1, and delta is a predefined operational parameter greater than zero.

6. The phase-locked loop device of claim 5, wherein phase detection circuitry is configured to update the error signal at a rate of NT, the slew-rate limiting circuitry is configured to update at a rate of nT, where N and n are positive integers with N being wholly divisible by n, and T is a time period of a bit.

7. The phase-locked loop device of claim 6, wherein N=686, and n is one of {1, 2, 7, 14, 49, 98, 343}.

8. The phase-locked loop device of claim 4, wherein operational parameters of the slew-rate limiting circuitry are set to form a first effective cutoff filter that allows the phase-locked loop to track changes in the wobble signal.

9. The phase-locked loop device of claim 8, wherein operational parameters of slew-rate limiting circuitry are also set to form a second effective cutoff filter that allows the phase-locked loop to effectively filter out SYNC marks in the input signal.

10. The phase-locked loop device of claim 1, further comprising a loop-filter configured to receive the modified error signal to produce a control signal, wherein the VCO is configured to receive the control signal to produce the VCO signal.

11. A method for reducing jitter in a phase-locked loop, comprising:
   receiving a wobble signal from an optical medium;
   performing a phase-detection operation on the wobble signal and a VCO signal to produce a phase error signal;

applying an amplitude dependent non-linear filtering process on the phase error signal to produce a modified error signal by reducing a sporadic jump in an amplitude of the phase error signal; and using the modified error signal to reduce jitter in VCO signal.

12. The method of claim 11, wherein using the modified error signal to reduce jitter in VCO signal includes:

performing a loop-filter process on the modified error signal to produce a control signal; and using the control signal to produce the VCO signal.

13. The method of claim 12, wherein the amplitude dependent non-linear filtering process substantially reduces an effect of SYNC marks embedded in the wobble signal.

14. The method of claim 13, wherein the amplitude dependent non-linear filtering process operates according to the following formula:

| | |
|---|---|
| $e\_SRL(m+1) = e\_SRL(m) + \text{delta}$ | $e - e\_SRL(m) > \text{delta}$ |
| $e\_SRL(m+1) = e\_SRL(m) - \text{delta}$ | $e - e\_SRL(m) < -\text{delta}$ |
| $e\_SRL(m+1) = e\_SRL(m)$ | otherwise | where e is the error signal, e_SRL(m) is the modified error signal for time increment m, e_SRL(m+1) is the modified error signal for time increment m+1, and delta is a predefined operational parameter greater than zero.

15. The method of claim 14, wherein the error signal is updated at a rate of NT, the modified error signal is updated at a rate of nT, where N and n are positive integers, N is divisible by n, and T is a time period of a bit.

16. The method of claim 15, wherein N=686, and n is one of {1, 2, 7, 14, 49, 98, 343}.

17. A phase-locked loop device for reducing jitter, comprising:

a voltage-control oscillator (VCO) configured to produce a VCO signal;

phase-detection circuitry configured to compare a wobble signal from an optical drive and the VCO signal to produce a phase error signal; and slew-rate limiting circuitry for receiving the phase error signal and applying an amplitude-dependent non-linear filtering process on the phase error signal to produce a modified error signal by reducing a sporadic jump in an amplitude of the phase error signal, wherein the modified error signal is used by the VCO to reduce jitter in the VCO signal.

18. The phase-locked loop device of claim 17, wherein the slew-rate limiting circuitry is configured to process the error signal according to the following formula:

| | |
|---|---|
| $e\_SRL(m+1) = e\_SRL(m) + \text{delta}$ | $e - e\_SRL(m) > \text{delta}$ |
| $e\_SRL(m+1) = e\_SRL(m) - \text{delta}$ | $e - e\_SRL(m) < -\text{delta}$ |
| $e\_SRL(m+1) = e\_SRL(m)$ | otherwise | where e is the error signal, e_SRL(m) is the modified error signal for time increment m, e_SRL(m+1) is the modified error signal for time increment m+1, and delta is a predefined operational parameter greater than zero.

19. The phase-locked loop device of claim 18, wherein the error signal is updated at a rate of NT, the slew-rate limiting circuitry is updated at a rate of nT, N and n are positive integers, where N is divisible by n, and T is a time period of a bit.

20. The phase-locked loop device of claim 17, wherein operational parameters of the slew-rate limiting circuitry are set to form an effective cutoff filter that allows the phase-locked loop to track changes in the wobble while effectively filtering sync marks in the wobble signal.

* * * * *